(12) United States Patent
Wu et al.

(10) Patent No.: US 10,778,202 B1
(45) Date of Patent: Sep. 15, 2020

(54) CLOCK SWITCHING APPARATUS AND METHOD

(71) Applicant: Realtek Semiconductor Corporation, Hsinchu (TW)

(72) Inventors: Po-Hsien Wu, Hsinchu (TW); Li-Yu Chen, Hsinchu (TW); Huan-Wen Chen, Zhubei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/561,290

(22) Filed: Sep. 5, 2019

(51) Int. Cl.
*H03K 5/135* (2006.01)
*G06F 1/08* (2006.01)

(52) U.S. Cl.
CPC ............ *H03K 5/135* (2013.01); *G06F 1/08* (2013.01)

(58) Field of Classification Search
CPC ......... H03L 7/00; H03K 5/135; H03K 17/005
See application file for complete search history.

(56) References Cited

U.S. PATENT DOCUMENTS

| 6,472,909 | B1* | 10/2002 | Young | G06F 1/08 |
| | | | | 327/144 |
| 8,729,947 | B2* | 5/2014 | Hwang | H03K 5/135 |
| | | | | 327/291 |
| 9,490,789 | B1* | 11/2016 | Tian | H03K 19/20 |

* cited by examiner

*Primary Examiner* — Hai L Nguyen
(74) *Attorney, Agent, or Firm* — Locke Lord LLP; Tim Tingkang Xia, Esq.

(57) ABSTRACT

A clock switching apparatus is provided. The clock input terminal receives a first clock signal as an input clock signal at first and start to receive a second clock signal as the input clock signal during a masking state of a masking signal within a clock-switching time period. The enabling synchronizing circuit receives a clock-switching enabling signal, receives the input clock signal and generate a synchronized enabling signal accordingly. The masking circuit receives the synchronized enabling signal and the mask signal to generate a final enabling signal. The output circuit receives the input clock signal, receive the final enabling signal that disables the output circuit only when either the masking signal is at the masking state or the synchronized enabling signal is at the clock-switching enabling state, and generate an output clock signal according to the input clock signal when the output circuit is enabled.

14 Claims, 4 Drawing Sheets

US 10,778,202 B1

CLOCK SWITCHING APPARATUS AND METHOD

BACKGROUND

Field of Invention

The present invention relates to a clock switching technology. More particularly, the present invention relates to a clock switching apparatus and a clock switching method.

Description of Related Art

Clock signals are the timing reference of the operation of electronic circuits. However, a single electronic circuit can be operated according to different clock signals that are selectable by a multiplexer. However, the clock signals may not on the same clock domain and may have phase offset therebetween. If no prevention mechanism is available, glitches may occur during the switching of the clock signals and result in data error.

Accordingly, what is needed is a clock switching apparatus and a clock switching method to address the issues mentioned above.

SUMMARY

An aspect of the present invention is to provide a clock switching apparatus that includes a clock input terminal, an enabling synchronizing circuit, a masking circuit and an output circuit. The clock input terminal is configured to receive a first clock signal as an input clock signal at first and start to receive a second clock signal as the input clock signal during a masking state of a masking signal within a clock-switching time period. The enabling synchronizing circuit is configured to receive a clock-switching enabling signal operated based on a reference clock, receive the input clock signal from the clock input terminal and generate a synchronized enabling signal on a clock domain same as the input clock signal accordingly, wherein the clock-switching enabling signal switches to a clock-switching enabling state only between the clock-switching time period, and the synchronized enabling signal switches to the clock-switching enabling state only according to the clock-switching enabling state of the clock-switching enabling signal and an activeness of the input clock signal. The masking circuit is configured to receive the synchronized enabling signal and the mask signal operated based on the reference clock to generate a final enabling signal. The output circuit is configured to receive the input clock signal from the clock input terminal, receive the final enabling signal that disables the output circuit only when either the masking signal is at the masking state or the synchronized enabling signal is at the clock-switching enabling state, and generate an output clock signal according to the input clock signal when the output circuit is enabled.

Another aspect of the present invention is to provide a clock switching method used in a clock switching apparatus that includes the steps outlined below. A first clock signal is received as an input clock signal at first by a clock input terminal. The clock-switching enabling signal operated based on a reference clock is received, the input clock signal from the clock input terminal is received and a synchronized enabling signal on a clock domain same as the input clock signal is generated accordingly by an enabling synchronizing circuit, wherein the clock-switching enabling signal switches to a clock-switching enabling state only between the clock-switching time period, and the synchronized enabling signal switches to the clock-switching enabling state only according to the clock-switching enabling state of the clock-switching enabling signal and an activeness of the input clock signal. The synchronized enabling signal is received and a mask signal operated based on the reference clock is received by a masking circuit to generate a final enabling signal. The input clock signal is received from the clock input terminal, the final enabling signal that disables an output circuit only when either the masking signal is at a masking state or the synchronized enabling signal is at the clock-switching enabling state, and an output clock signal is generated according to the input clock signal when the output circuit is enabled by the output circuit. A second clock signal is started to be received as the input clock signal by the clock input terminal during the masking state of the masking signal within a clock-switching time period.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
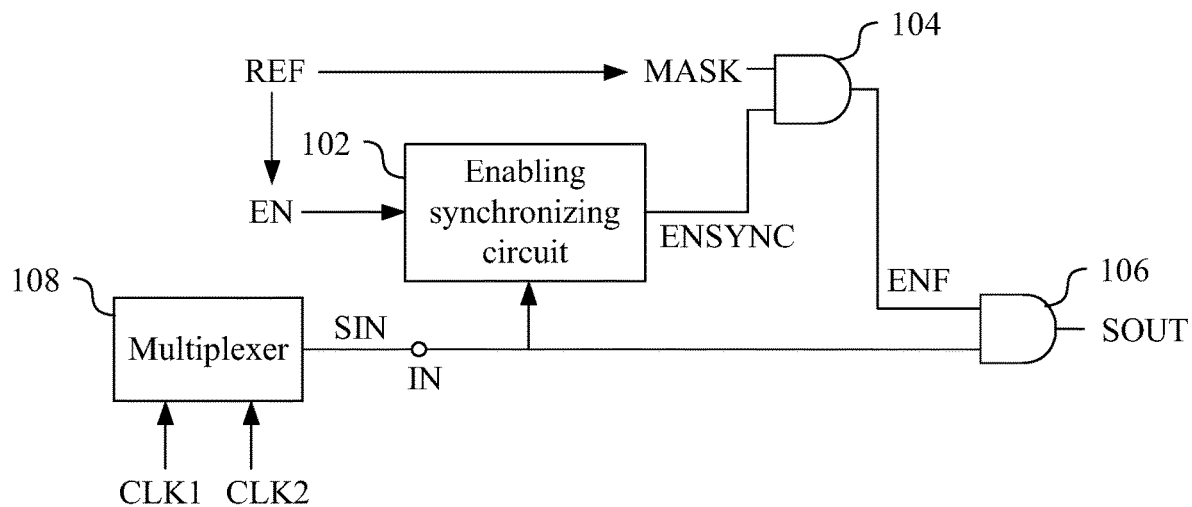
FIG. 1 is a block diagram of a clock switching apparatus in an embodiment of the present invention.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1. FIG. 1 is a block diagram of a clock switching apparatus 100 in an embodiment of the present invention. The clock switching apparatus 100 is configured to selectively receive and output a first clock signal CLK1 or a second clock signal CLK2, in which the first clock signal CLK1 and the second clock signal CLK2 may not be synchronous and may not be in the same clock domain.

The clock switching apparatus 100 is configured to guarantee that during the switching of the first clock signal CLK1 and the second clock signal CLK2, no glitch is generated.

Figure 2:
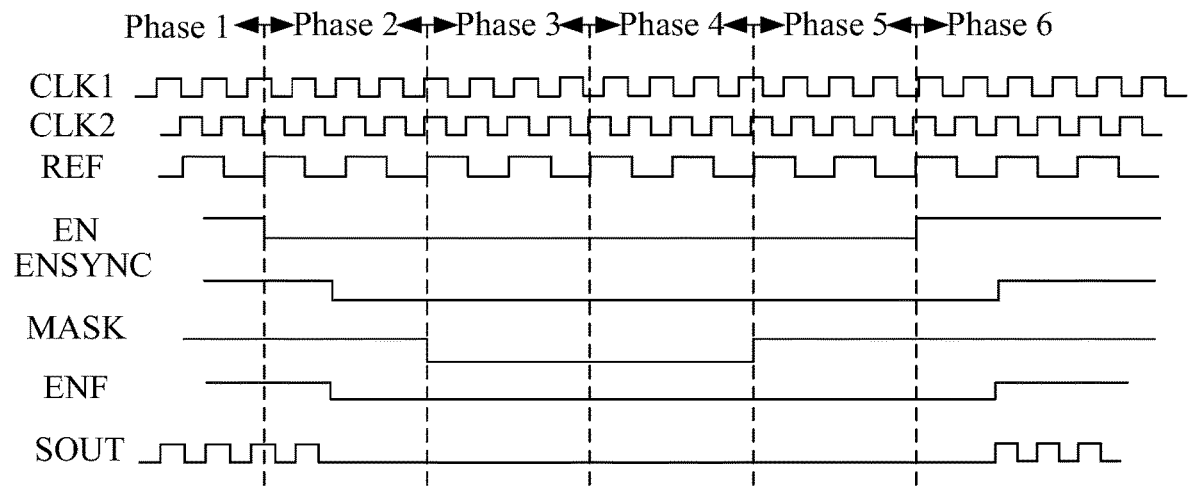
FIG. 2 is a timing diagram of signals in the clock switching apparatus in a first embodiment of the present invention.

Reference is made to FIG. 2 at the same time. FIG. 2 is a timing diagram of signals in the clock switching apparatus 100 in a first embodiment of the present invention.

The configuration and the operation of the clock switching apparatus 100 are described in detail in the following paragraphs in accompany with FIG. 1 and FIG. 2.

The clock switching apparatus 100 includes a clock input terminal IN, an enabling synchronizing circuit 102, a masking circuit 104 and an output circuit 106.

The clock input terminal IN is configured to receive either the first clock signal CLK1 or the second clock signal CLK2 as an input clock signal SIN, in which in the present embodiment, as illustrated in FIG. 2, the first clock signal CLK1 and the second clock signal CLK2 are both active. More specifically, each of the first clock signal CLK1 and the second clock signal CLK2 oscillates between a high state and a low state.

In an embodiment, the clock switching apparatus 100 may further include a multiplexer 108 to select one of the first clock signal CLK1 or the second clock signal CLK2 based on a selection signal SL. In an embodiment, the clock input terminal IN receives the first clock signal CLK1 as the input clock signal SIN first.

In an embodiment, the enabling synchronizing circuit 102 is a synchronizer flip-flop circuit. The enabling synchronizing circuit 102 is configured to receive a clock-switching enabling signal EN operated based on a reference clock REF and receive the input clock signal SIN, which is the first clock signal CLK1 at first, from the clock input terminal IN. In an embodiment, the reference clock REF is a non-stop clock and may not be in the same clock domain as the first clock signal CLK1 or the second clock signal CLK2.

The enabling synchronizing circuit 102 generates a synchronized enabling signal ENSYNC on a clock domain same as the input clock signal SIN according to the clock-switching enabling signal EN and the input clock signal SIN.

In an embodiment, the clock-switching enabling signal EN is at a clock-switching disabling state during Phase 1 of the operation of the clock switching apparatus 100 illustrated in FIG. 2, in which the clock-switching state is a high state in the present embodiment. Further, the clock-switching enabling signal EN switches to a clock-switching enabling state only between a clock-switching time period spanning from Phase 2 to Phase 5 of the operation of the clock switching apparatus 100, in which the clock-switching enabling state is a low state in the present embodiment.

The synchronized enabling signal ENSYNC switches to the clock-switching enabling state only according to the clock-switching enabling state of the clock-switching enabling signal EN and the activeness of the input clock signal SIN. As a result, in the present embodiment, the synchronized enabling signal ENSYNC is at the clock-switching disabling state (i.e. the high state) in Phase 1 since the clock-switching enabling signal EN is at the clock-switching disabling state and switches to the clock-switching enabling state (i.e. the low state) in Phase 2 since the clock-switching enabling signal EN switches to the clock-switching enabling state and the input clock signal SIN (the first clock signal CK1) is active.

The masking circuit 104 is configured to receive the synchronized enabling signal ENSYNC and a mask signal MASK operated based on the reference clock REF to generate a final enabling signal ENF. In an embodiment, the masking signal MASK is at a masking state only within the clock-switching time period, in which in the present embodiment, the masking signal MASK is at the masking state only in Phase 3 and Phase 4 of the operation of the clock switching apparatus 100. In the present embodiment, the masking state is a low state. As a result, the masking signal MASK is at an unmasking state (high state) in Phase 1 and Phase 2, switches to the masking state (low state) in Phase 3 and Phase 4 and switches back to the unmasking state (high state) in Phase 5 and Phase 6.

The final enabling signal ENF is configured to disables the output circuit 106 only when either the masking signal MASK is at the masking state or the synchronized enabling signal ENSYNC is at the clock-switching enabling state. When the output circuit 106 is enabled, the output circuit 106 generates an output clock signal SOUT according to the input clock signal SIN, in which in an embodiment, the output circuit 106 directly outputs the input clock signal SIN as the output clock signal SOUT. Further, when the output circuit 106 is disabled, the output circuit 106 outputs an inactive signal, i.e. a low state signal, as the output clock signal SOUT.

The statuses of the signals of the clock switching apparatus 100 from Phase 1 to Phase 6 are described sequentially in the following paragraphs.

In an embodiment, each of the masking circuit 104 and the output circuit 106 is an AND logic gate. As a result, the final enabling signal ENF is at an enabling state (high state) in Phase 1 since the synchronized enabling signal ENSYNC is at the clock-switching disabling state (high state) and the masking signal MASK is at the unmasking state (high state) to enable the output circuit 106 to output the first clock signal CLK1 as the output clock signal SOUT.

In Phase 2, the clock-switching enabling signal EN switches to the clock-switching enabling state (low state). In an embodiment, the switching of the clock-switching enabling signal EN marks the beginning of the clock-switching event and can be triggered by either the control of the user or the control of other circuits. Accordingly, the synchronized enabling signal ENSYNC switches to the clock-switching enabling state (low state) too in Phase 2 with a delay for a certain time period relative to the switching of the clock-switching enabling signal EN.

It is appreciated that due to the operation of the enabling synchronizing circuit 102, the switching of the clock-switching enabling signal EN is on the clock domain of the reference clock REF, while the switching of the synchronized enabling signal ENSYNC is on the clock domain of the first clock signal CLK1.

Due to the clock-switching enabling state (low state) of the synchronized enabling signal ENSYNC, the masking circuit 104 generates the final enabling signal ENF having the disabling state (low state) in Phase 2 as well to disable the output circuit 106 such that the output clock signal SOUT becomes the inactive signal (low state).

In Phase 3, the masking signal MASK switches to the masking state (low state) such that the masking circuit 104 keeps generating the final enabling signal ENF having the disabling state (low state) to disable the output circuit 106 such that the output clock signal SOUT becomes the inactive signal (low state).

In Phase 4, the clock input terminal IN starts to receive the second clock signal CLK2 as the input clock signal SIN according to the selection of the multiplexer 108. However, since the masking signal MASK is still at the masking state, the masking circuit 104 keeps generating the final enabling signal ENF having the disabling state (low state) to disable the output circuit 106 such that the output clock signal SOUT becomes the inactive signal (low state).

In Phase 5, the masking signal MASK switches back to the unmasking state (high state). However, since the clock-switching enabling signal EN is still at the clock-switching enabling state (low state) and the input clock signal SIN (i.e. the second input clock CLK2 is active), the synchronized enabling signal ENSYNC is kept at the clock-switching enabling state (low state) such that the masking circuit 104 keeps generating the final enabling signal ENF having the disabling state (low state) to disable the output circuit 106 such that the output clock signal SOUT becomes the inactive signal (low state).

In Phase 6, the clock-switching enabling signal EN switches back to the clock-switching disabling state (high state). In an embodiment, the switching of the clock-switching enabling signal EN marks the ending of the clock-switching event and can be triggered by either the control of the user or the control of other circuits. Accordingly, the synchronized enabling signal ENSYNC switches to the clock-switching disabling state (high state) too in Phase 6 with a delay for a certain time period relative to the switching of the clock-switching enabling signal EN.

It is appreciated that due to the operation of the enabling synchronizing circuit 102, the switching of the clock-switching enabling signal EN is on the clock domain of the reference clock REF, while the switching of the synchronized enabling signal ENSYNC is on the clock domain of the second clock signal CLK2.

Due to the clock-switching disabling state (high state) of the synchronized enabling signal ENSYNC and the unmasking state (high state), the masking circuit 104 generates the final enabling signal ENF having the enabling state (high state) in Phase 6 as well to enable the output circuit 106 to output the second clock signal CLK2 as the output clock signal SOUT.

As a result, before the output circuit 106 is disabled, the output clock signal SOUT is the first clock signal CLK1 and after the output circuit 106 is enabled again, the output clock signal SOUT is the second clock signal CLK2. The clock-switching is accomplished.

The clock switching apparatus 100 of the present invention can use the masking circuit 104 to mask the output circuit 106 for a certain time period to allow the clock input terminal IN to switch the input clock signal SIN from the first clock signal CLK1 to the second clock signal CLK2. Further, the enabling synchronizing circuit 102 further ensures that the output circuit 106 to stop outputting the first clock signal CLK1 at a time spot synchronous to the clock domain of the first clock signal CLK1, and start outputting the second clock signal CLK2 at another time spot synchronous to the clock domain of the second clock signal CLK2. The occurrence of glitch during the clock-switching event can be prevented.

It is appreciated that the embodiment described above is under the condition that both the first clock signal CLK1 and the second clock signal CLK2 are active. However, in other embodiments, at least one of the first dock signal CLK1 and the second clock signal CLK2 can be inactive.

Figure 3:
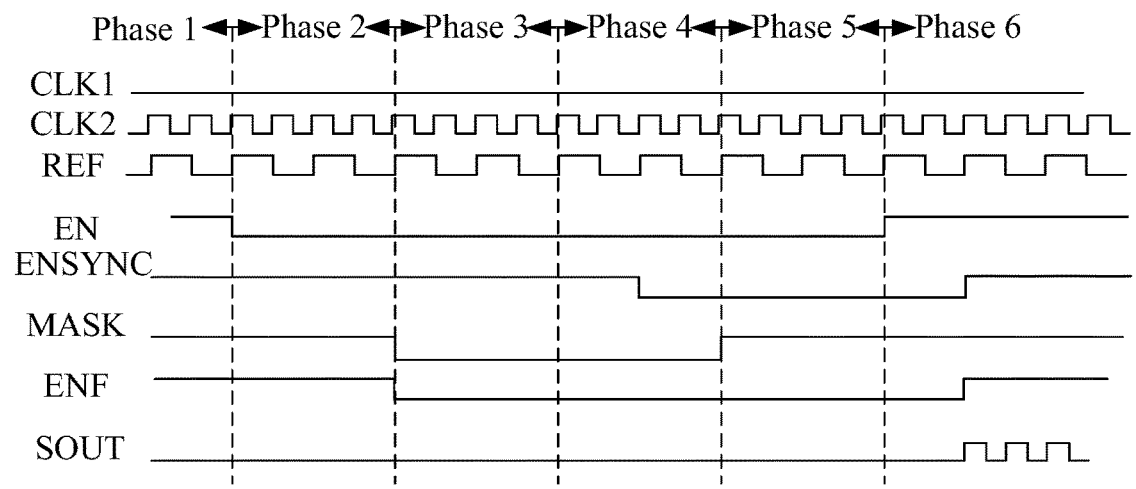
FIG. 3 is a timing diagram of signals in the clock switching apparatus in a second embodiment of the present invention.

Reference is now made to FIG. 3. FIG. 3 is a timing diagram of signals in the clock switching apparatus 100 in a second embodiment of the present invention.

The configuration and the operation of the clock switching apparatus 100 under the condition that the first clock signal CLK1 is inactive (low state) and the second clock signal CLK2 is active are described in detail in the following paragraphs in accompany with FIG. 1 and FIG. 3.

In Phase 1, the final enabling signal ENF is at the enabling state (high state) in Phase 1 since the synchronized enabling signal ENSYNC is at the clock-switching disabling state (high state) and the masking signal MASK is at the unmasking state (high state) to enable the output circuit 106 to output the first clock signal CLK1 as the output clock signal SOUT, in which the first clock signal CLK1 is the inactive signal (low state).

In Phase 2, the clock-switching enabling signal EN switches to the clock-switching enabling state (low state). In an embodiment, the switching of the clock-switching enabling signal EN marks the beginning of the clock-switching event and can be triggered by either the control of the user or the control of other circuits. However, since the first clock signal CLK1 is inactive, the synchronized enabling signal ENSYNC is kept at the clock-switching disabling state (high state) in Phase 2.

Due to the clock-switching disabling state (high state) of the synchronized enabling signal ENSYNC and the unmasking state (high state) of the masking signal MASK, the masking circuit 104 generates the final enabling signal ENF having the enabling state (high state) in Phase 2 as well to enable the output circuit 106 output the first clock signal CLK1 as the output clock signal SOUT.

In Phase 3, the masking signal MASK switches to the masking state (low state) such that the masking circuit 104 generates the final enabling signal ENF switching to the disabling state (low state) to disable the output circuit 106 such that the output clock signal SOUT becomes the inactive signal (low state).

In Phase 4, the clock input terminal IN starts to receive the second clock signal CLK2 as the input clock signal SIN according to the selection of the multiplexer 108. However, since the masking signal MASK is still at the masking state, the masking circuit 104 keeps generating the final enabling signal ENF having the disabling state (low state) to disable the output circuit 106 such that the output clock signal SOUT becomes the inactive signal (low state).

However, since the clock-switching enabling signal EN is at the clock-switching enabling state (low state) and the current input clock signal SIN (i.e. the second clock signal CLK2) is active, the synchronized enabling signal ENSYNC switches to the clock-switching enabling state (low state) in Phase 4, in which the switching of the synchronized enabling signal ENSYNC is on the on the clock domain same as the input clock signal SIN (i.e. the second clock signal CLK2).

For Phase 5 and Phase 6, the operation is identical to the first embodiment illustrated in FIG. 2 such that the output circuit 106 starts to output the second clock signal CLK2 as the output clock signal SOUT. As a result, no further detail is described herein.

Accordingly, the clock switching apparatus 100 can still prevent the occurrence of the glitch during the clock-switching event under the condition that the first clock signal CLK1 is inactive and the second clock signal CLK2 is active.

Figure 4:
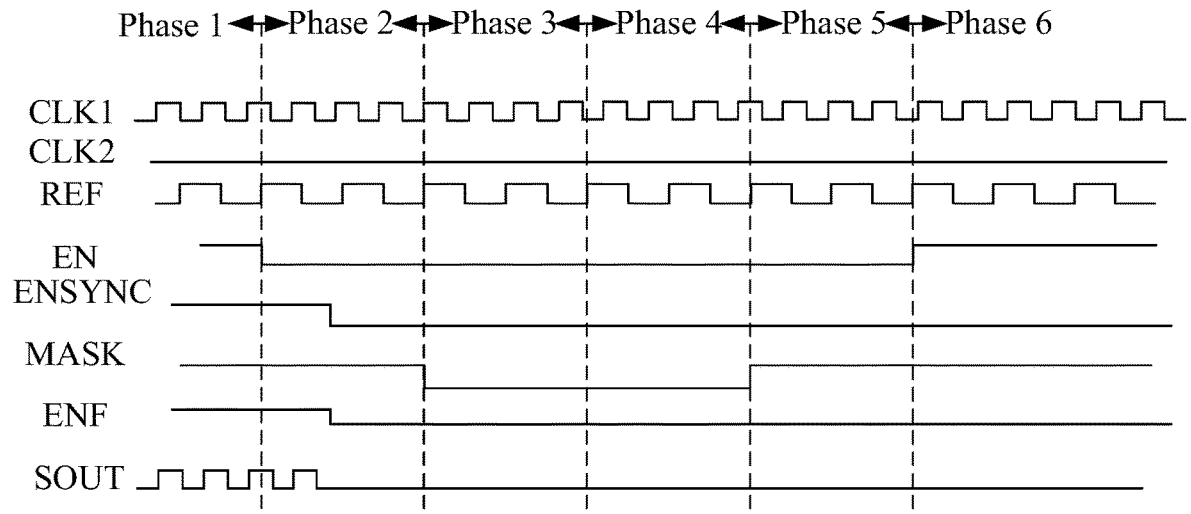
FIG. 4 is a timing diagram of signals in the clock switching apparatus in a third embodiment of the present invention.

Reference is now made to FIG. 4. FIG. 4 is a timing diagram of signals in the clock switching apparatus 100 in a third embodiment of the present invention.

The configuration and the operation of the clock switching apparatus 100 under the condition that the first clock signal CLK1 is active and the second clock signal CLK2 is inactive (low state) are described in detail in the following paragraphs in accompany with FIG. 1 and FIG. 4.

For Phase 1 to Phase 5, the operation is identical to the first embodiment illustrated in FIG. 2. As a result, no further detail is described herein.

Since the input clock signal SIN becomes the second clock signal CLK2 in Phase 4 that is inactive, in Phase 6, the synchronized enabling signal ENSYNC is kept at the clock-switching enabling state (low state) such that the masking circuit 104 keeps generating the final enabling signal ENF having the disabling state (low state) to disable the output circuit 106 such that the output clock signal SOUT becomes the inactive signal (low state), which is the same as the second clock signal CLK2.

Accordingly, the clock switching apparatus 100 can still prevent the occurrence of the glitch during the clock-switching event under the condition that the first clock signal CLK1 is active and the second clock signal CLK2 is inactive.

Figure 5:
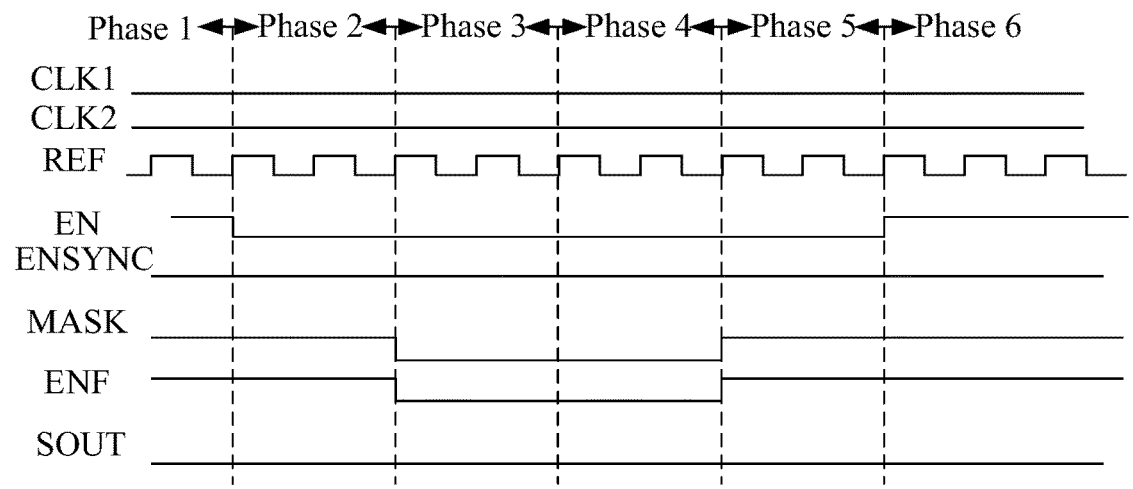
FIG. 5 is a timing diagram of signals in the clock switching apparatus in a fourth embodiment of the present invention.

Reference is now made to FIG. 5. FIG. 5 is a timing diagram of signals in the clock switching apparatus 100 in a fourth embodiment of the present invention.

The configuration and the operation of the clock switching apparatus 100 under the condition that both of the first clock signal CLK1 and the second clock signal CLK2 are inactive (low state) are described in detail in the following paragraphs in accompany with FIG. 1 and FIG. 5.

For Phase 1 to Phase 3, the operation is identical to the second embodiment illustrated in FIG. 3. As a result, no further detail is described herein.

Since the input clock signal SIN becomes the second clock signal CLK2 in Phase 4 that is inactive, the synchronized enabling signal ENSYNC is kept at the clock-switching disabling state (high state) in Phase 4. However, since the masking signal MASK is still at the masking state, the masking circuit 104 keeps generating the final enabling signal ENF having the disabling state (low state) to disable the output circuit 106 such that the output clock signal SOUT becomes the inactive signal (low state).

In Phase 5, the synchronized enabling signal ENSYNC is kept at the clock-switching disabling state (high state) due to the inactiveness of the second clock signal CLK2, and the masking signal MASK switches back to the unmasking state (high state). The masking circuit 104 generates the final enabling signal ENF having the enabling state (high state) accordingly to enable the output circuit 106 to output the second clock signal CLK2, which is the inactive signal (low state) as the output clock signal SOUT.

In Phase 6, the clock-switching enabling signal EN switches back to the clock-switching disabling state (high state). In an embodiment, the switching of the clock-switching enabling signal EN marks the ending of the clock-switching event and can be triggered by either the control of the user or the control of other circuits. However, the synchronized enabling signal ENSYNC is already at the clock-switching disabling state (high state) and the masking signal MASK is also at the unmasking state (high state). The masking circuit 104 generates the final enabling signal ENF having the enabling state (high state) accordingly to enable the output circuit 106 to output the second clock signal CLK2, which is the inactive signal (low state) as the output clock signal SOUT.

Accordingly, the clock switching apparatus 100 can still prevent the occurrence of the glitch during the clock-switching event under the condition that both of the first clock signal CLK1 and the second clock signal CLK2 are inactive (low state).

It is appreciated that the configuration of the clock switching apparatus 100 may be different in different embodiments. In other embodiments, other circuit components can be used to accomplish the same mechanism. Further, the duration of the phases and the time periods illustrated in FIG. 2 to FIG. 5 may be different in different embodiments. The present invention is not limited thereto.

Figure 6:
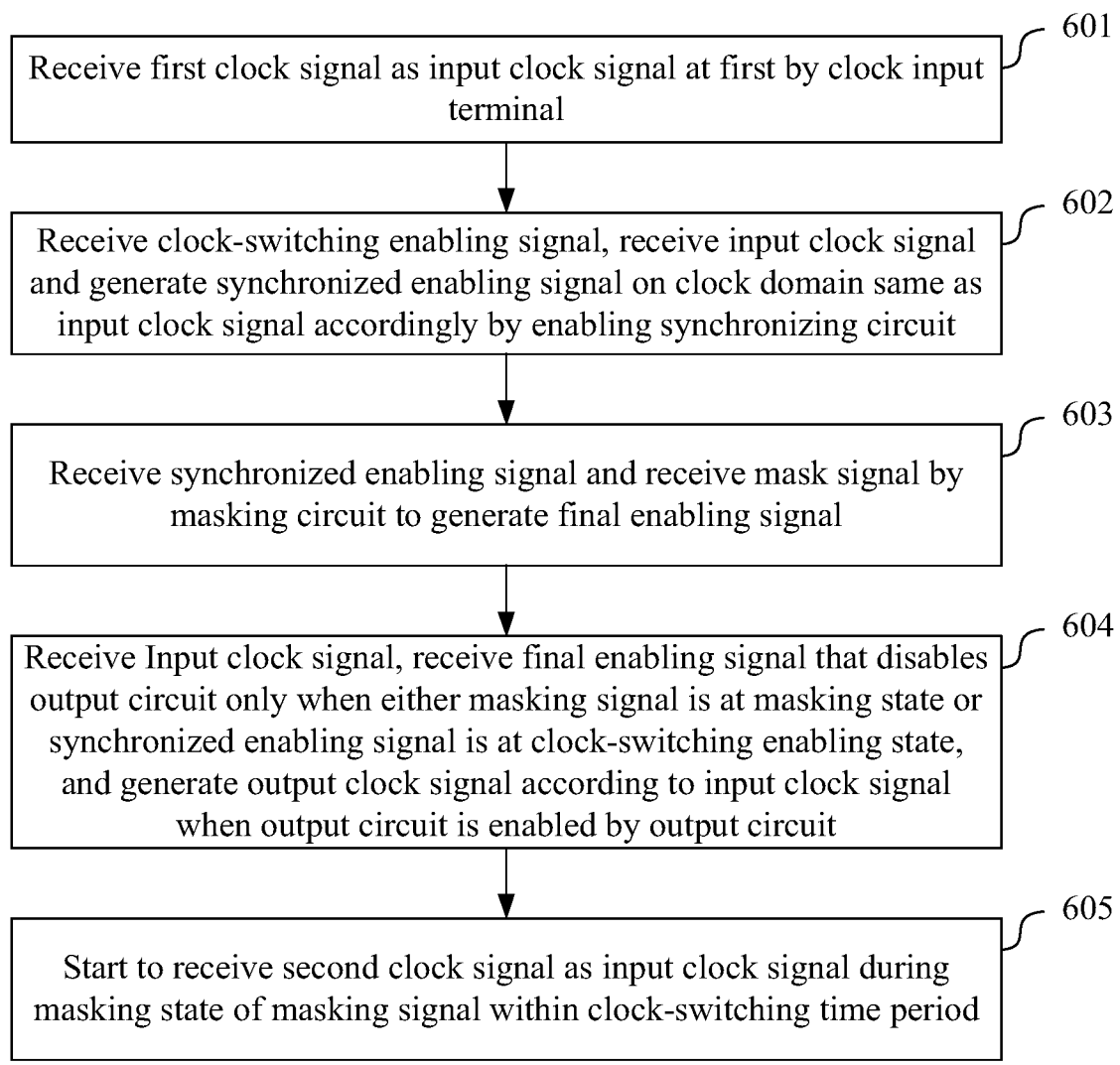
FIG. 6 is a flowchart of a clock switching method in an embodiment of the present invention.

FIG. 6 is a flowchart of a clock switching method 600 in an embodiment of the present invention. The clock switching method 600 can be used in the clock switching apparatus 100 illustrated in FIG. 1. The clock switching method 600 includes the operations outlined below (The operations are not recited in the sequence in which the operations are performed. That is, unless the sequence of the operations is expressly indicated, the sequence of the operations is interchangeable, and all or part of the steps may be simultaneously, partially simultaneously, or sequentially performed).

In step 601, the first clock signal CLK1 is received as the input clock signal SIN at first by the clock input terminal IN.

In step 602, the clock-switching enabling signal EN is received, the input clock signal SIN is received and the synchronized enabling signal ENSYNC on a clock domain same as the input clock signal SIN is generated accordingly by the enabling synchronizing circuit 102, wherein the clock-switching enabling signal EN switches to the clock-switching enabling state only between the clock-switching time period, and the synchronized enabling signal ENSYNC switches to the clock-switching enabling state only according to the clock-switching enabling state of the clock-switching enabling signal EN and the activeness of the input clock signal SIN.

In step 603, the synchronized enabling signal ENSYNC is received and a mask signal MASK is received by the masking circuit 104 to generate the final enabling signal.

In step 604, the input clock signal SIN is received from the clock input terminal IN, the final enabling signal ENF that disables the output circuit 106 only when either the masking signal MASK is at the masking state or the synchronized enabling signal ENSYNC is at the clock-switching enabling state, and the output clock signal SOUT is generated according to the input clock signal SIN when the output circuit 106 is enabled by the output circuit 106.

In step 605, the second clock signal CLK2 is started to be received as the input clock signal SIN by the clock input terminal IN during the masking state of the masking signal MASK within the clock-switching time period.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. An apparatus, comprising:
a clock input terminal configured to receive a first clock signal as an input clock signal at first and start to receive a second clock signal as the input clock signal during a masking state of a masking signal within a clock-switching time period;
an enabling synchronizing circuit configured to receive a clock-switching enabling signal operated based on a reference clock, receive the input clock signal from the clock input terminal and generate a synchronized enabling signal on a clock domain same as the input clock signal accordingly, wherein the clock-switching enabling signal switches to a clock-switching enabling state only between the clock-switching time period, and the synchronized enabling signal switches to the clock-switching enabling state only according to the clock-switching enabling state of the clock-switching enabling signal and an activeness of the input clock signal;

a masking circuit configured to receive the synchronized enabling signal and the mask signal operated based on the reference clock to generate a final enabling signal; and an output circuit configured to receive the input clock signal from the clock input terminal, receive the final enabling signal that disables the output circuit only when either the masking signal is at the masking state or the synchronized enabling signal is at the clock-switching enabling state, and generate an output clock signal according to the input clock signal when the output circuit is enabled.

2. The apparatus of claim 1, wherein before the output circuit is disabled, the output clock signal is the first clock signal and after the output circuit is enabled again, the output clock signal is the second clock signal.

3. The apparatus of claim 1, wherein the enabling synchronizing circuit is a synchronizer flip-flop circuit.

4. The apparatus of claim 1, wherein each of the masking circuit and the output circuit is an AND logic gate.

5. The apparatus of claim 4, wherein each of the clock-switching disabling state and the unmasking state is a high state and each of the clock-switching enabling state and the masking state is a low state.

6. The apparatus of claim 1, wherein the reference clock is a non-stop clock.

7. The apparatus of claim 1, further comprising a multiplexer configured to select the first clock signal as the input clock signal at first and start to select the second clock signal as the input clock signal during the masking state of the masking signal.

8. A method comprising:
receiving a first clock signal as an input clock signal at first by a clock input terminal;
receiving a clock-switching enabling signal operated based on a reference clock, receiving the input clock signal from the clock input terminal and generating a synchronized enabling signal on a clock domain same as the input clock signal accordingly by an enabling synchronizing circuit, wherein the clock-switching enabling signal switches to a clock-switching enabling state only between a clock-switching time period, and the synchronized enabling signal switches to the clock-switching enabling state only according to the clock-switching enabling state of the clock-switching enabling signal and an activeness of the input clock signal;
receiving the synchronized enabling signal and a mask signal operated based on the reference clock by a masking circuit to generate a final enabling signal;
receiving the input clock signal from the clock input terminal, receiving the final enabling signal that disables an output circuit only when either the masking signal is at a masking state or the synchronized enabling signal is at the clock-switching enabling state, and generating an output clock signal according to the input clock signal when the output circuit is enabled by the output circuit; and
starting to receive a second clock signal as the input clock signal by the clock input terminal during the masking state of the masking signal within the clock-switching time period.

9. The method of claim 8, wherein before the output circuit is disabled, the output clock signal is the first clock signal and after the output circuit is enabled again, the output clock signal is the second clock signal.

10. The method of claim 8, wherein the enabling synchronizing circuit is a synchronizer flip-flop circuit.

11. The method of claim 8, wherein each of the masking circuit and the output circuit is an AND logic gate.

12. The method of claim 11, wherein each of the clock-switching disabling state and the unmasking state is a high state and each of the clock-switching enabling state and the masking state is a low state.

13. The method of claim 8, wherein the reference clock is a non-stop clock.

14. The method of claim 8, further comprising:
selecting the first clock signal as the input clock signal at first and starting to select the second clock signal as the input clock signal during the masking state of the masking signal by a multiplexer.

* * * * *